United States Patent [19]

Nicoli

[11] 4,157,500

[45] Jun. 5, 1979

[54] MULTIPERIODICAL PHASEMETER

[75] Inventor: Jacques A. G. Nicoli, Paris, France

[73] Assignee: Societe d'Exploitation de Produits et de Techniques pour l'Aeronautique & l'Automatique, France

[21] Appl. No.: 846,789

[22] Filed: Oct. 31, 1977

[51] Int. Cl.² ............................................ G01R 25/00
[52] U.S. Cl. ................................... 324/83 R; 328/133
[58] Field of Search ........................... 324/83 R, 83 D; 328/133, 155

[56] References Cited

U.S. PATENT DOCUMENTS 3,323,053   5/1967   Southern ........................... 324/83 D Primary Examiner—M. Tokar
Attorney, Agent, or Firm—Mason, Kolehmainen, Rathburn & Wyss

[57] ABSTRACT

The invention provides a multiperiodical phasemeter which is arranged to supply a rectangular wave showing the instantaneous value of the difference to be measured between two waves, said phasemeter being connected to a display means which indicates said instantaneous value of said dephasing between two waves, a multiperiodical phasemeter wherein the phasemeter is connected to a low-pass filter producing the average value of said rectangular wave, differentiator for said average wave, a polarity detector parting into two distinct channels differentiated signals depending on the polarity thereof, a memory circuit consisting of a bistable multivibrator operated by the signals of the two said channels, and whereby the display means consists of an up-down counter operated by the signals of said memory so as to perform counting up or counting-down of the signals issued from the phasemeter.

5 Claims, 7 Drawing Figures

MULTIPERIODICAL PHASEMETER

The invention provides a multiperiodical phasemeter.

Up-to-date phasemeters provide a measurement of phases limited to ±180° and/or → 360°. The measurement of a phase being reserved to the characterization of periodical waves, from which it results a systematic ambiguity of values 0° and 360° and the multiples thereof or ±180° and the multiples thereof.

Up-to-date phasemeters give a good accuracy (>0.1° at frequencies lower than MHZ) by locating zero crossings. The comparison of the input signal when passing through zero results in the output in a rectangular wave with rise and fall times that depend only on the transfer characteristics (gain and bandwidth) of the amplitude comparator used.

FIG. 2 shows the result of said comparison made with the input signals shown in FIG. 1. Through the play of the comparison with a high gain, the slope of the signals has greatly increased thus making negligible, in relation to the T period, the lack of precision due to the time they need to get up or down. If at the time $t_0$ a bistable multivibrator is engaged and the period of same interrupted at the time $t_1$, the shape of wave shown in FIG. 3 is obtained. If, on the other hand, said multivibrator is arranged so as to permit at the time $t_0$ and up to the time $t_1$ to put in the circuit a source preferably with a precise amplitude $V_{ref}$ and during the remaining of the period to leave the potential reaching zero, then the average value of this rectangular wave will read:

$$V_m = V_{ref}(t/T)$$

and will represent the phase of the input signal in relation to the reference.

In most phasemeters, the generating of the average continuous voltage is obtained through the action of a low-pass filter with an appropriate cut off frequency the simplest of which is the integrator system with resistance and capacity. The main restriction set on the use of phasemeters is the ambiguity referred to hereabove. As a matter of fact, FIG. 3 obviously shows that nothing differentiates the time $t_0$ located at the beginning of the period from that which indicates the starting of the following one; accordingly, the phases 0°, ±360° . . . n×±360° are ambiguous. In some applications (for example the measurement of fluid velocity) operating in a mode, the variation in phase may, exceed 360°, and make the measurement ambiguous.

The aim of the present invention is particularly to remedy said drawbacks and to this end provides a multiperiodical phasemeter having a single period phasemeter arranged for producing a rectantular wave which represents the instantaneous value of the phase differences measured between two waves, said phasemeter being connected to a display means to identify said instantaneous value of said phase difference in said both waves, wherein the single period phasemeter is connected with a low-pass filter producing the average value of the rectangular wave, an analogical differentiator for said average wave, a polarity detector splitting the differentiated signals into two distinct channels depending on the polarity thereof, and a memory circuit consisting of a bistable multivibrator operated by the signals of both said channels.

The invention is presented by way of non-limitative example in the attached drawings, wherein.

Figures 1, 2, 3:
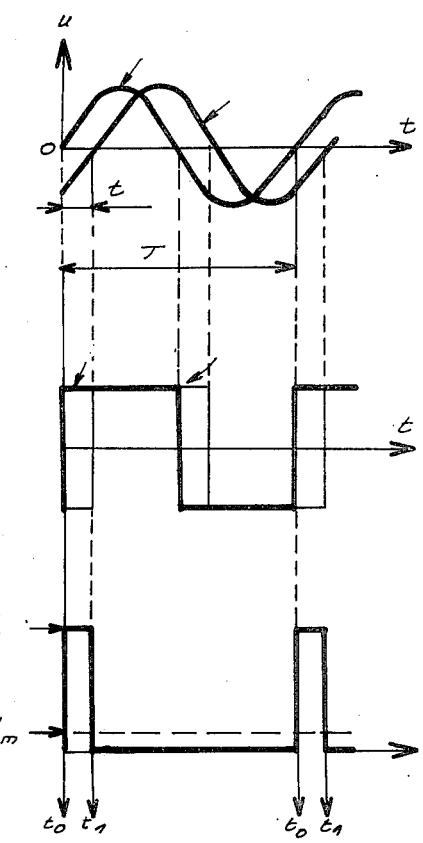
FIG. 1 is a waveform diagram showing two waveforms whose phases are to be compared.
FIG. 2 is a rectangular wave representative of the zero crossings of the signals depicted in FIG. 1.
FIG. 3 is a rectangular waveform representative of the phase difference between the waveforms of FIG. 1.
Figure 4:
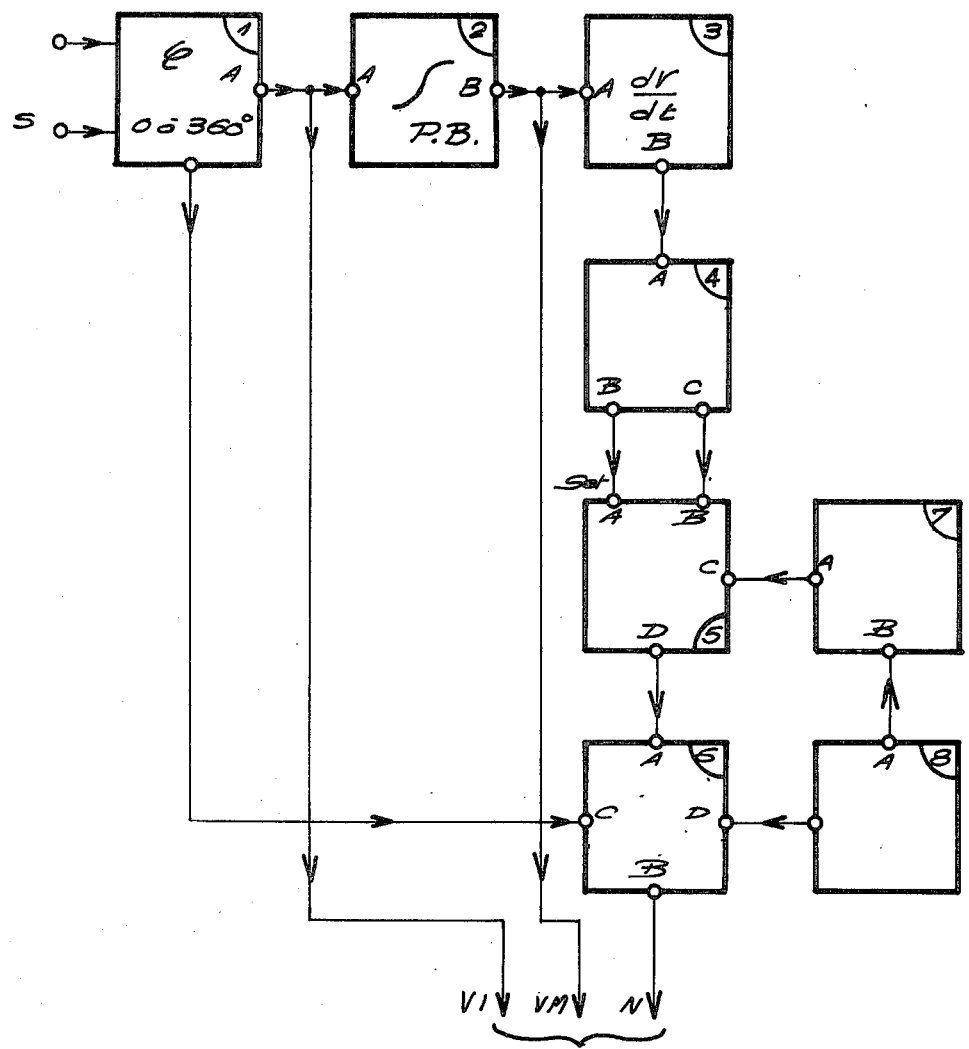
FIG. 4 shows a synoptical diagram of one embodiment of the multiperiodical phasemeter provided by the invention.
Figure 5:
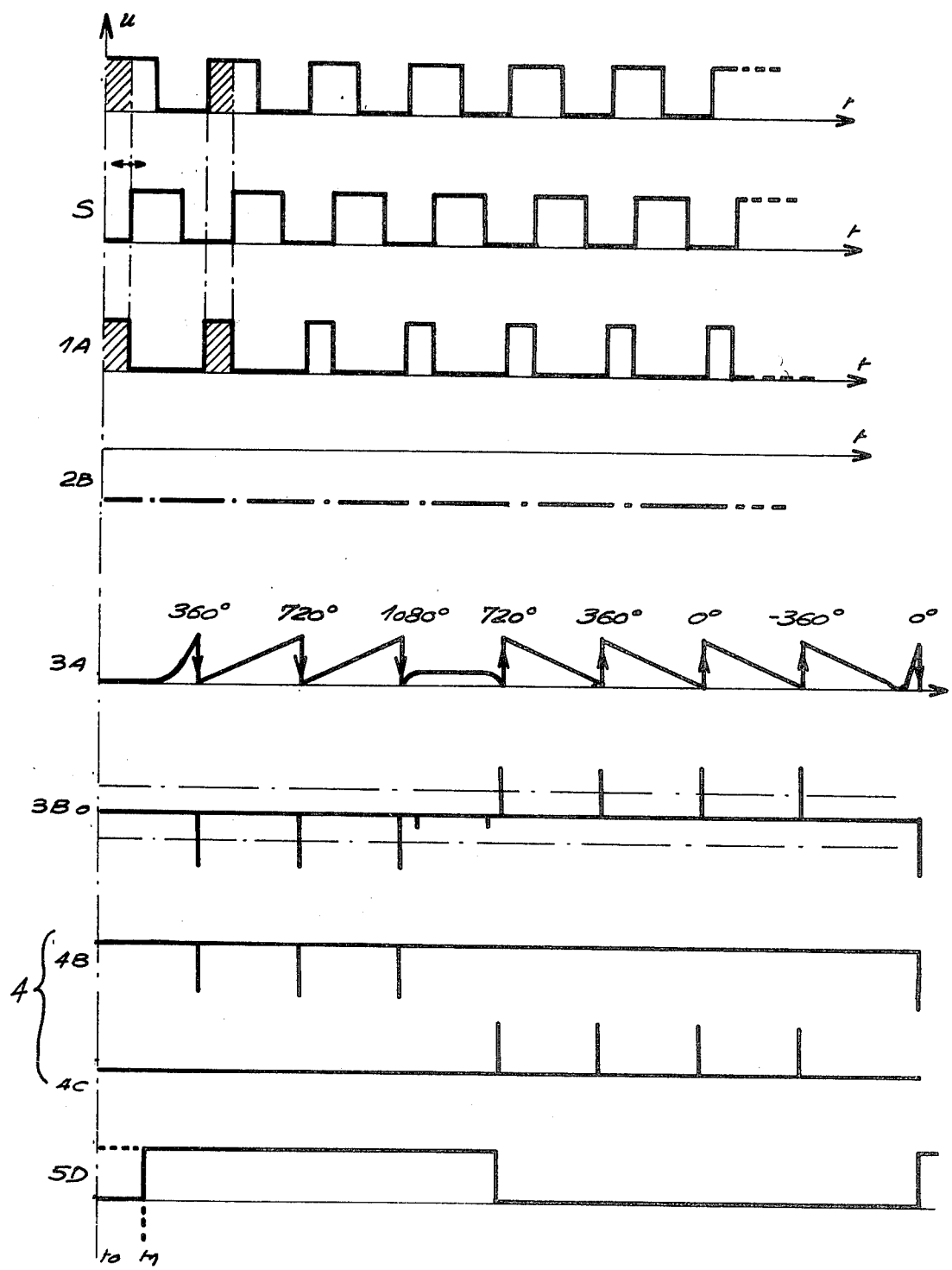
FIG. 5 is a timing diagram of the signals recorded at significant points in the phasemeter shown in FIG. 4.

By making reference to FIGS. 4 and 5, it can be seen that the phasemeter 1 receives the harmonic wave referenced Ref and the signal to be measured S at its input terminals.

The phasemeter 1 is arranged to produce at its output terminal A a rectangular wave which represents the instantaneous phase difference between both waves.

The signal 1A is applied to the low-pass filter 2 which extracts the average value thereof. Said low-pass filter is an active filter whose cut off frequency is adjusted to limit the residual harmonic ripple to an acceptable value. The output voltage 2B of said filter 2 represents the average value of the phase difference between the signal S and the reference Ref within the limits 0° and 360° (Voltage null at 0° (+) and maximal at 360°).

Where the wave to be measured varies by ± several periods, the average value of the curved signal 3A undergoes a sudden change in level each time there is a passage through 360°. For a positive variation, that is from 360° (−) to 360° (+), the sudden variation in level is in the negative direction, on the other hand, a negative variation in phase, that is from 360° (+) to 360° (−), generates a variation in level with a positive slope (see the direction of arrows of the curve 3A in FIG. 5).

The analogical differentiating device 3 receives at its input terminal 3A the signal which represents the average phase difference and the output terminal 3B thereof supplies the first derivative of the input signal. Then, the latter only involves the wave faces representing passages through +360°, differentiated depending on the direction of the variation. The aim of the polarity detector 4 is to split into two distinct channels the input signals 4A generated by the differentiator 3. The polarity detector 4 consists of a full wave detector with semi-conductive diodes whose purpose is to direct to the terminal 4B only negative pulses and to direct to the terminal 4C the only positive pulses.

It can be seen on the curve representing the signals appearing at the terminal 4B that the sequence starts by a negative control signal, that is caused by a positive phase difference of 360°. The negative pulses are respectively transmitted to the terminals operating the memory circuit 5 consisting of a bistable multivibrator (flip-flop). The terminal 5A of said multivibrator is excited only by negative pulses which bring the terminal D up to the high logical state, while the terminal 5B is responsive only to positive pulses which the terminal D of the multivibrator down to its low logical state. By way of convention, it will be understood that the high logical level will subsequently operate the up-down counting device 6 in an up counting mode and that the high level will operate the device 6 in a down counting mode.

The type of memory with a bistable multivibrator used does not make it possible to change the state of its outlet logical level unless a pulse with a suitable polarity applied to its input terminal 5A (set) or a pulse with an opposite polarity applied to its terminal 5B (Reset). Accordingly, further to a transition in level, a succession of driving pulses having a polarity identical to the first one applied on to either of the input terminals is not effective. Before performing any new measurement, the electronic circuits are reset to zero through a sudden rise of voltage applied at the time $t_0$ to the terminal 8A of the reset to zero device.

The setting circuit 7 electrically coupled with the reset to zero device 8 is aimed to achieve a previous setting by sensitizing the circuits of the multivibrator 5 from the time $t_1$. From that time, the terminal 5D of the memory is brought up to the high logical level and is accordingly capable to supply the counting device with the order to count without any additional authorization. The up down counting device 6 receives at its terminal 6C the normalized pulses generated by the phasemeter 1 each time the signal passes over the phase 360° and at its terminal 6A the order to count up or count down, the total n being available every time at the terminal 6B.

At the output of said phasemeter, it will then be possible to have the instantaneous value $V_i$ of the phase difference included between +0° and +360°, as well as the number of passages n of the vector through the origin determining the total of said phase difference.

So as to make clear the operation of the multiperiodical phasemeter, reference will be made to the two following examples (single examples including no fractional parts of phase to be added or substracted).

Figure 6:
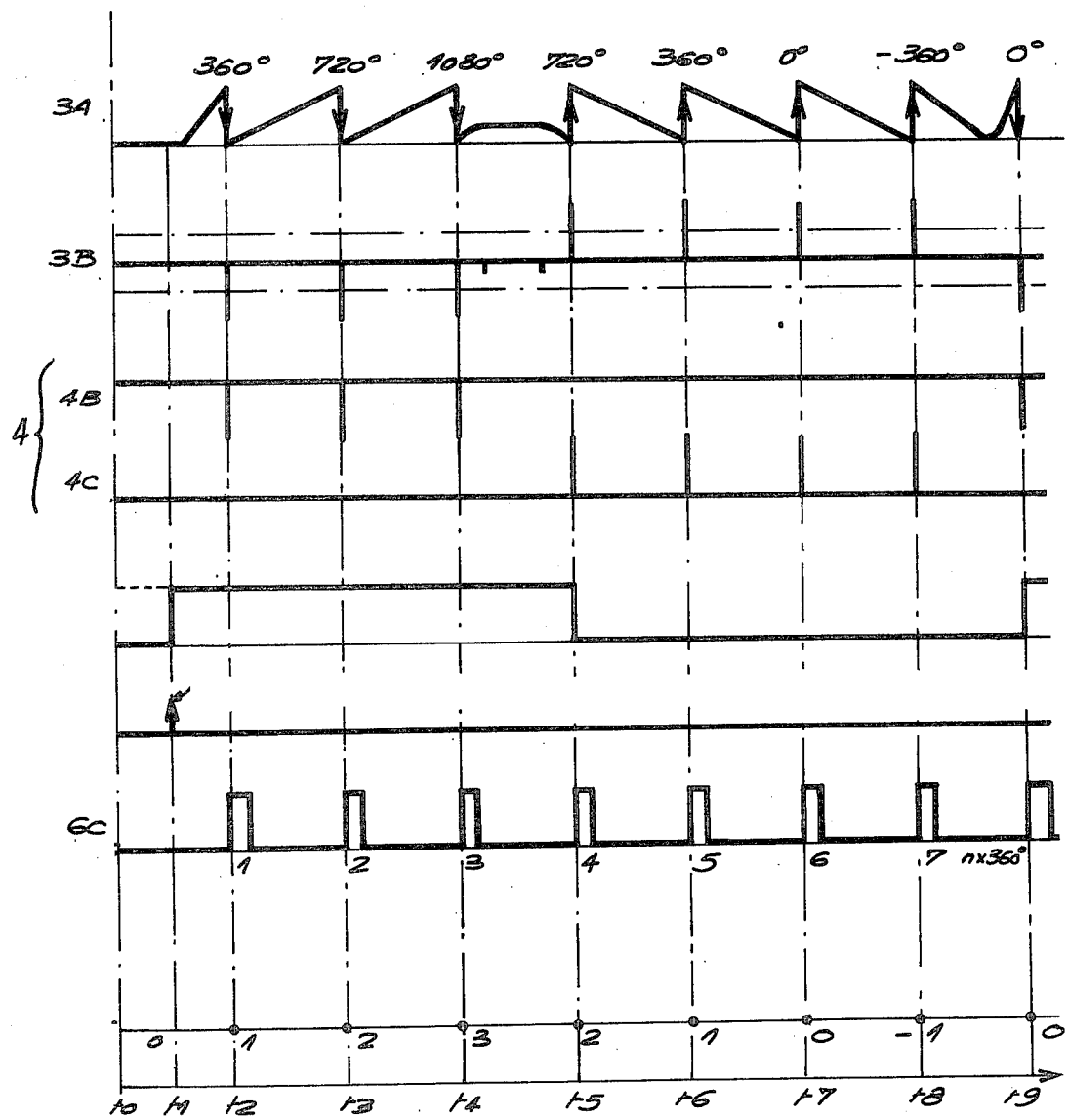
FIG. 6 shows an example of the measurement of a phase difference of several periods.

Viz the arbitrary sequence shown in FIG. 6. The memory 5 has previously been reset to zero by the device 8 at the time $t_0$.

At the time $t_1$, the operator has set the memory 5 which reaches the high logical state. From the time $t_1$, the phasemeter entirely works automatically.

At the time $t_2$, the first pulse to be counted which will be applied to the terminal 6C and the polarity pulse which will be applied to the terminal 5A of the memory simultaneously occur. As the latter has been previously set to allow the counting, the polarity pulse has no effect on its logical state and the up-down counting device shows the coincidence of the logical states by counting:

1 at the time $t_2$,
2 at the time $t_3$,
3 at the time $t_4$,

The result of the counting gathered at the output terminal 6B of the up-down counting device represents by way of convention:

+1 → +360°

+2 → +720°

+3 → +1080°

From $t_5$ four positive polarity driving impulses are initiated in succession up to $t_8$, the first one of which applied to the terminal 5A will make the logical state of the memory reach its low level thus instructing the up-down counting device 6 to count down four units.

By applying the same convention, one has successively:

| Former Total | | New Total | Phase |
|---|---|---|---|
| + 3 − 1 | = | + 2 → | + 720° |
| + 2 − 1 | = | + 1 → | + 360° |
| + 1 − 1 | = | 0 → | 0° |
| 0 − 1 | = | − 1 → | − 360° |

Finally, at the time $t_9$, the polarity sign becoming positive again, the memory again reaches its high state thus instructing the up-down counting device 6 to count the pulse which reaches the terminal 6C at that time and which, added to the preceding total, gives the following result:

$$-1 + 1 = 0 \rightarrow 0°$$

Figure 7:
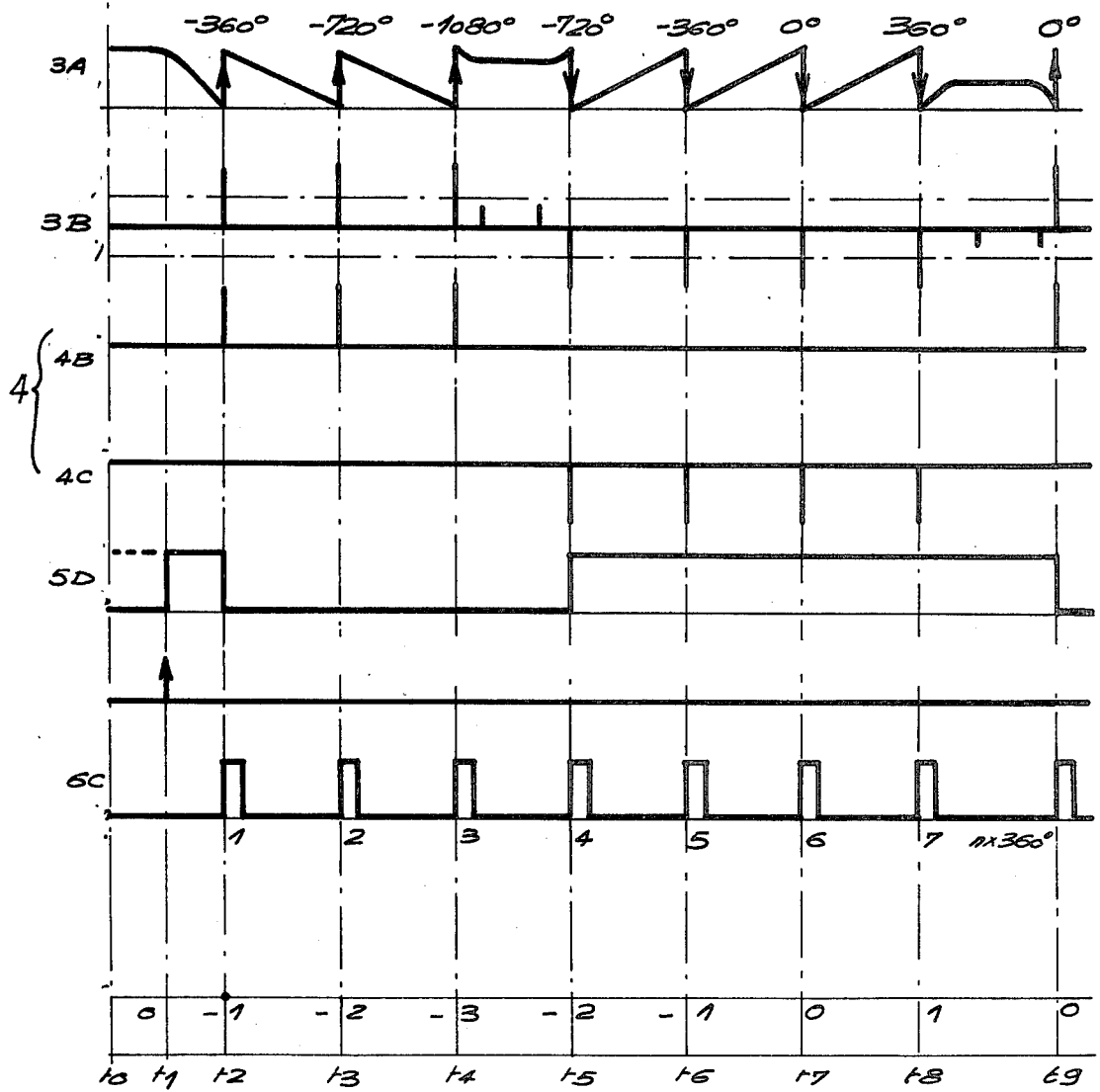
FIG. 7 is a diagram of a further example of the measurement of phase difference.

The second example is illustrated in FIG. 7.

The chronological order of the new sequence remaining identical to the preceding one, one has:

at the time $t_0$ the reset to zero of the electronic circuits, at the time $t_1$, the setting of the memory.

From $t_2$, the new sequence shows that the input pulses have a polarity opposite to the preceding one, which leads to:

| Time | Counting | Total | Phase |
|---|---|---|---|
| $t_0$ | 0 | 0 | 0° |
| $t_1$ | 0 | 0 | 0° |
| $t_2$ | − 1 | − 1 | − 360° |
| $t_3$ | − 1 | − 2 | − 720° |
| $t_4$ | − 1 | − 3 | − 1080° |
| $t_5$ | + 1 | − 2 | − 720° |
| $t_6$ | + 1 | − 1 | − 360° |
| $t_7$ | + 1 | 0 | 0° |
| $t_8$ | + 1 | + 1 | + 360° |
| $t_9$ | − 1 | 0 | 0° |

Of course, the invention is not limited to the modes of embodiment disclosed and depicted hereabove from which other variants can be provided without thereby departing from the scope of the invention.

What I claim is:

1. A multi-period phasemeter for measuring the phase difference between two input signals, comprising:
   means including a single period phase detector for providing a rectangular wave signal having a pulse width that varies from a first value to a second value in accordance with the instantaneous phase difference between said two input signals, said pulse width varying from said first value to said second value each time said phase difference is shifted by 360°;
   means coupled to said phase detector for receiving and integrating said rectangular wave signal and providing a signal representative of the average value of said rectangular wave signal;
   means coupled to said integrating means for receiving and differentiating said average value representative signal and providing a differentiated signal having first and second polarity portions representative of the slopes of said differentiated signal; and
   means including an up-down counter for providing a signal representative of the difference in number of plus 360° and minus 360° phase shifts detected by said phase detector, said difference being representative of the phase difference between said two input signals.

2. A phasemeter according to claim 1, wherein a discriminator of amplitude is added which permits to restrict the measurement to the area of phases included between +180° and −180°.

3. A multi-period phasemeter as recited in claim 1, wherein said difference signal providing means includes a memory device operable to a first state by said first polarity portions, and to a second state by said second polarity portions for causing said up-down counter to up-count when said memory device is in said first state and to down-count when said memory device is in said second state.

4. A multi-period phasemeter as recited in claim 3 further including a polarity detector responsive to said differentiating means for separating said first and second polarity portions of said differentiated signal into first and second channels and applying said first and second polarity portions to said memory means for altering the state thereof.

5. A multi-period phasemeter as recited in claim 4 wherein said memory means includes a bistable multivibrator.

* * * * *